US009035651B2

(12) United States Patent
Nittka

(10) Patent No.: US 9,035,651 B2
(45) Date of Patent: May 19, 2015

(54) MRI METHOD AND MRI OPERATING SYSTEM GENERATING AN RF PULSE SEQUENCE WITH SLICE SELECT GRADIENTS DURING IDENTICAL AMPLITUDE RF PULSES AND A MATCHED BANDWIDTH SLICE CONGRUENCY

(75) Inventor: Mathias Nittka, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 598 days.

(21) Appl. No.: 13/308,723

(22) Filed: Dec. 1, 2011

(65) Prior Publication Data
US 2012/0139539 A1 Jun. 7, 2012

(30) Foreign Application Priority Data

Dec. 1, 2010 (DE) .......................... 10 2010 062 290

(51) Int. Cl.
*G01R 33/565* (2006.01)
*G01R 33/56* (2006.01)

(52) U.S. Cl.
CPC ...... *G01R 33/56563* (2013.01); *G01R 33/5602* (2013.01); *G01R 33/5607* (2013.01); *G01R 33/56536* (2013.01); *G01R 33/56572* (2013.01)

(58) Field of Classification Search
USPC .......................... 324/300–322; 600/407–435; 382/128–131
See application file for complete search history.

(56) References Cited

U.S. PATENT DOCUMENTS

| 4,506,223 | A | * | 3/1985 | Bottomley et al. | ........... 324/309 |
|---|---|---|---|---|---|
| 4,868,501 | A | * | 9/1989 | Conolly | ........................ 324/309 |
| 5,446,384 | A | * | 8/1995 | Dumoulin | ..................... 324/307 |
| 5,548,216 | A | * | 8/1996 | Dumoulin et al. | ............ 324/309 |
| 7,091,720 | B2 | * | 8/2006 | Heubes | ......................... 324/309 |
| 7,366,560 | B2 | * | 4/2008 | Taicher et al. | ................. 600/410 |
| 7,898,254 | B2 | * | 3/2011 | Feinberg et al. | .............. 324/309 |
| 2005/0017719 | A1 | * | 1/2005 | Heubes | ......................... 324/309 |
| 2006/0293587 | A1 | * | 12/2006 | Taicher et al. | ................. 600/410 |
| 2009/0212773 | A1 | * | 8/2009 | Feinberg et al. | .............. 324/309 |
| 2010/0033179 | A1 | | 2/2010 | Hargreaves et al. | .......... 324/309 |
| 2010/0183504 | A1 | * | 7/2010 | Chen | ............................ 424/1.29 |
| 2011/0123192 | A1 | * | 5/2011 | Rosenthal et al. | .............. 398/43 |
| 2012/0056620 | A1 | * | 3/2012 | Feinberg et al. | .............. 324/309 |
| 2012/0139539 | A1 | * | 6/2012 | Nittka | ........................... 324/309 |

(Continued)

OTHER PUBLICATIONS

"Magnetic Resonance Imaging Physical Principles and Sequence Design," Haacke et al. (1999) pp. 175-178.

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method for generating a pulse sequence for operating a magnetic resonance (MR) system for acquiring data from an examination subject having an interfering object in the patient's body, the bandwidths of at least two of the RF (radio-frequency) pulses in the pulse sequence are matched such that the matched RF pulses respectively excite a congruent slice when they are radiated into an examination subject under the effect of a slice selection gradient of identical amplitude. The matching of the RF pulses in the manner ensures so that the respective slices excited by the at least two RF pulses are subject to the same nonlinearities and inhomogeneities, and therefore the same spatial distortions, and so that signal losses due to inconsistent excitations of the two pulses are avoided. The image data that can be acquired with the pulse sequence are therefore optimized.

11 Claims, 2 Drawing Sheets

(56) References Cited

U.S. PATENT DOCUMENTS

2012/0223706 A1* 9/2012 Hetherington et al. ....... 324/307
2012/0319686 A1* 12/2012 Jesmanowicz et al. ....... 324/309
2013/0085379 A1* 4/2013 Feinberg ....................... 600/419
2014/0002077 A1* 1/2014 Deshpande et al. .......... 324/309

OTHER PUBLICATIONS

"Improved MR Imaging for Patients With Metallic Implants," Viano et al., Magnetic Resonance Imaging, vol. 18 (2000) pp. 287-295.

* cited by examiner

MRI METHOD AND MRI OPERATING SYSTEM GENERATING AN RF PULSE SEQUENCE WITH SLICE SELECT GRADIENTS DURING IDENTICAL AMPLITUDE RF PULSES AND A MATCHED BANDWIDTH SLICE CONGRUENCY

BACKGROUND OF THE INVENTION

1. Field of the Invention

The invention concerns a magnetic resonance system and a method and a non-transitory computer-readable data storage medium encoded with programming instructions to generate a pulse sequence for operating a magnetic resonance system.

2. Description of the Prior Art

Magnetic resonance is a known modality with which images of the inside of an examination subject can be generated (in the following the abbreviation MR stands for "magnetic resonance"). The dependency of the precession frequencies (Larmor frequencies) of excited spins on the magnetic field strength of the prevailing magnetic field of the magnetic resonance system is thereby used for spatial resolution. The prevailing magnetic field is composed of the basic magnetic field of the magnet unit of the magnetic resonance system and applied gradient magnetic fields. Typical methods for reconstruction of image data sets from magnetic resonance signals require a homogeneous basic magnetic field and strictly linear gradient magnetic fields.

Due to the dependency of the Larmor frequencies on the prevailing magnetic field, geometric distortions along the frequency coding direction (readout direction) result in the image data sets acquired from the magnetic resonance signals in the case of inhomogeneities of the basic magnetic field. The distortions are proportional to local deviations of the basic magnetic field and inversely proportional to the strength of the frequency coding gradient.

Given nonlinearities of the gradient fields, the distortions are situated both in the tomographical image plane and perpendicular to this given slice excitations with a selection gradient. In practice, such inhomogeneities of the basic magnetic field and nonlinearities of gradient fields cannot be entirely avoided. The deviations of the basic magnetic field—thus the inhomogeneity—should nevertheless be smaller than 3 ppm ("parts per million") within a measurement volume of a magnetic resonance apparatus.

MR examinations are also conducted on patients with metallic implants if this is allowed by the implant manufacturer. However, depending on the material, size and possibly shape, such implants generate significant image distortions due to strong susceptibility effects since they in particular significantly disrupt the homogeneity of the basic magnetic field, which can lead to the distortions described above.

The distortions of the applied magnetic field that are caused by the implants can corrupt the MR examination to the degree that, for example, MR measurements which require a spectrally selective excitation (likewise controlled via the Larmor frequencies of the participating substances) can no longer be implemented due to the more severe development of artifacts. One prominent example of such spectrally selective MR techniques is spectral fat saturation. The fat saturation serves to make it possible to differentiate a fat signal (which otherwise appears bright in the generated image data) and, for example, signals of inflamed tissue or, respectively, fluid accumulations.

For MR examinations in the environment of implants, it is most often attempted to suppress fat signals in a different manner, for example via what are known as "inversion recovery techniques", in particular STIR ("short tau inversion recovery"). Apart from the geometric distortions mentioned above, however, strong susceptibility artifacts in the environment of the implants also lead to significant artifacts (for example in the form of regions with incomplete fat suppression and/or in the form of regions with significant signal losses).

For MR examinations in the environment of implants, optimally high readout bandwidths (high receiver bandwidth, high resolution) and high bandwidths of the employed RF pulses (short RF pulses, thin slices) have previously been sought to reduce the image distortions. However, this does not always lead to the desired goal and often can also not be directly influenced by a user.

SUMMARY OF THE INVENTION

An object of the invention is to provide a magnetic resonance system, a method and a non-transitory computer-readable data storage medium encoded with programming instructions to generate a pulse sequence for operating a magnetic resonance system, with which artifacts in MR examinations due to inhomogeneities and nonlinearities in an applied magnetic field can be reduced or even avoided.

Within the scope of the present invention, a pulse sequence for a magnetic resonance system for measurements of an examination subject afflicted by an interfering body is [sic], characterized in that the bandwidths of at least two of the RF pulses (RF: radio-frequency) occurring in the pulse sequence are matched (tuned) such that the matched RF pulses respectively excite a congruent slice when they are radiated into an examination subject under the effect of a slice selection gradient having an identical amplitude.

The matching of the RF pulses in the manner according to the invention ensures that the respective slices excited by the at least two RF pulses are subjected to the same nonlinearities and inhomogeneities, and therefore to the same spatial distortions, and that signal losses due to inconsistent excitations of the two pulses are avoided. The image data that can be acquired with the pulse sequence are therefore optimized.

In one embodiment, the bandwidths of at least one RF pulse from a group of RF pulses (for example refocusing pulses and/or DEFT ("driven equilibrium Fourier transform") pulses are matched with the bandwidth of an RF pulse which is an excitation pulse.

In one embodiment, the pulse sequence is an inversion recovery pulse sequence, and additionally or alternatively the bandwidth of an RF pulse (which is an inversion pulse) is matched with the bandwidth of an RF pulse which is an excitation pulse.

A method according to the invention to generate a pulse sequence includes the following steps:
selecting a pulse sequence type while establishing the parameters of an RF pulse of the pulse sequence type for a desired MR measurement,
calibrating the bandwidth of at least one additional RF pulse of the pulse sequence type to the bandwidth of an established RF pulse of the pulse sequence type such that the matched RF pulses respectively excite a congruent slice if they are radiated into an examination subject under the effect of a slice selection gradient having identical amplitude.

A magnetic resonance system according to the invention has a magnet unit, a transmission/reception device, a gradient system, and a control device, and is characterized in that the control device controls the transmission/reception device and the gradient system such that a pulse sequence is generated in which the bandwidths of at least two of the RF (radio-frequency) pulses occurring in the pulse sequence are matched such that the matched RF pulses respectively excite a congruent slice if they are radiated into an examination subject under the effect of a slice selection gradient having identical amplitude.

The invention also encompasses a non-transitory computer-readable data storage medium encoded with programming instructions that, when the storage medium is loaded into a computerized operating unit for a magnetic resonance system cause the operating unit to operate the magnetic resonance system with a pulse sequence as described above.

The invention also encompasses a non-transitory computer-readable data storage medium encoded with programming instructions that, when loaded into a processor, cause the processor to generate a pulse sequence as described above.

The advantages and embodiments described with regard to the pulse sequence apply to the method, the magnetic resonance system, and the electronically readable data storage medium.

DESCRIPTION OF THE PREFERRED EMBODIMENTS

Figure 1:
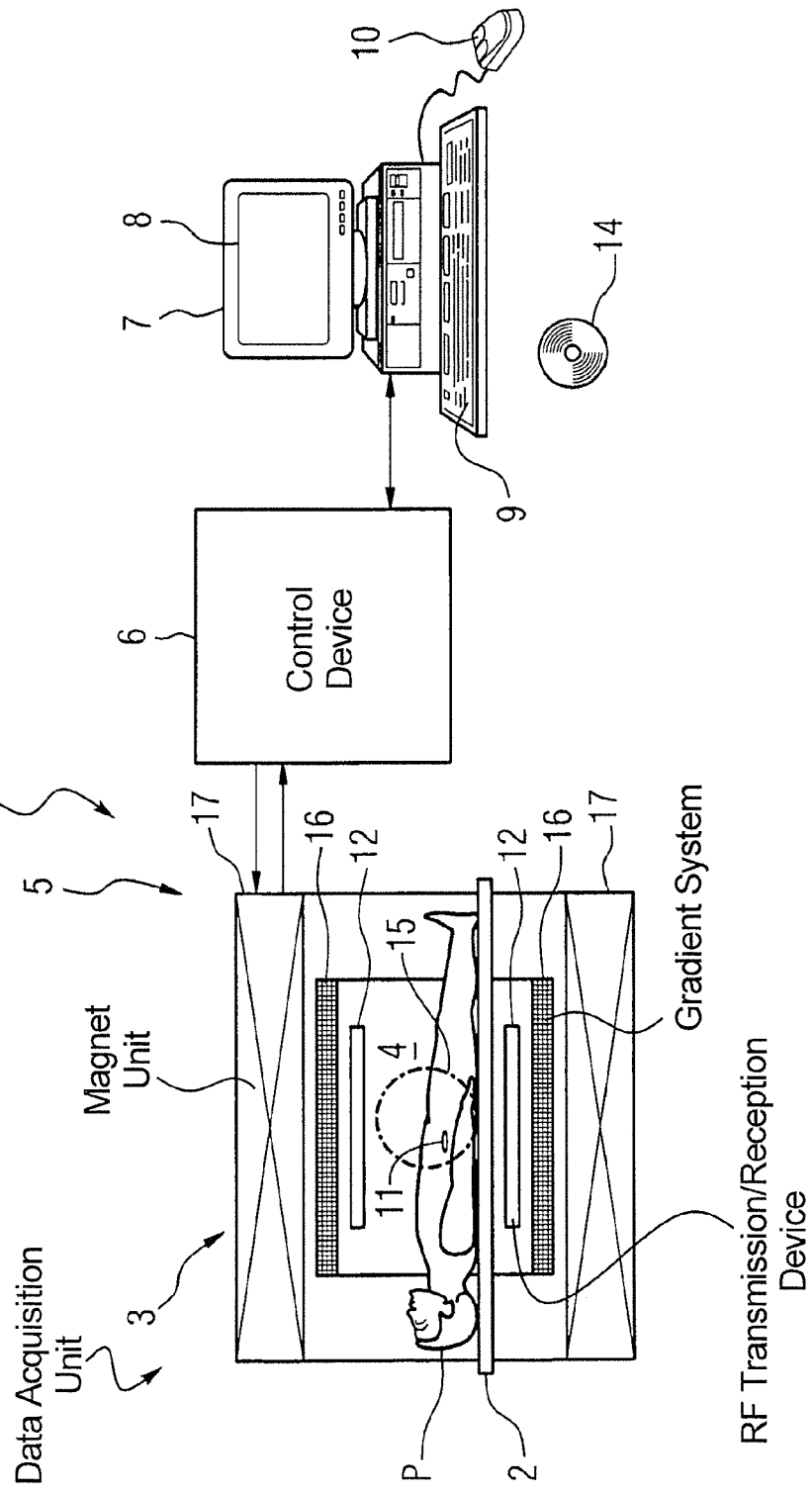
FIG. 1 schematically illustrates a magnetic resonance system according to the invention.

A magnetic resonance system 5 according to the invention is schematically shown in FIG. 1. The magnetic resonance system 5 includes a data acquisition unit (scanner) 3 with a magnet unit 17 and: a gradient system 16 with which the magnetic field (including gradient field) necessary for the MR examination is generated in a measurement space 4, a transmission/reception device 12 to transmit RF excitation pulses and acquire echo signals, a table 2; a control device 6 with which the scanner 3 is controlled and raw data are received from the tomograph 3, and a terminal 7 connected to the control device 6. The transmission/reception device 12 can be formed by separate transmission and reception units and/or switchable transmission-and-reception units.

The control device 6 can control the transmission/reception device 12 and the gradient system 16 such that a pulse sequence is generated in which the bandwidths of at least two of the RF (radio-frequency) pulses occurring in the pulse sequence are matched, such that both pulses respectively excite a congruent slice if they are radiated into an examination subject under the effect of a slice selection gradient with identical amplitude.

During the generation of an image data set, echo signals are received from the transmission/reception device 12 by means of the tomograph 3, wherein the gradient system 16 and the transmission/reception device 12 are activated by the control device 6 such that, by means of a method according to the invention, MR data are acquired in a measurement volume 15 which is located inside the body of an examination subject (a patient P, for example) situated on the table 2. The examination subject P is hereby possibly affected by an interfering body 11 (an implant, for example) which is likewise situated in the measurement volume 15.

The control device 6 receives the acquired echo signals as raw data and stores and processes these.

In particular, the control device 6 processes the read-out raw data via reconstruction such that they can be graphically presented at a presentation device 8, for example on a monitor 8 of the terminal 7. In addition to the graphical presentation of the image data reconstructed from the raw data, with the terminal 7 (which comprises an input device, for example a keyboard 9 and/or a computer mouse 10, in addition to the monitor 8) a three-dimensional volume segment can be provided by a user as an imaging area, for example, and additional parameters can be defined for implementation of the method according to the invention. The software for the control device 6 can also be loaded into the control device 6 via the terminal 7. This software of the control device 6 can thereby also embody one of the methods according to the invention. It is also possible for one of the method embodiments according to the invention to be contained in software that runs on the terminal 7. Independent of the software that embodies the method according to the invention, the software can be stored on an electronically readable data medium (a DVD 14, for example) so that this software can then be read from the DVD 14 by the terminal 7 and be copied into the control device 6 or into a computer of the terminal 7 itself.

Figure 2:
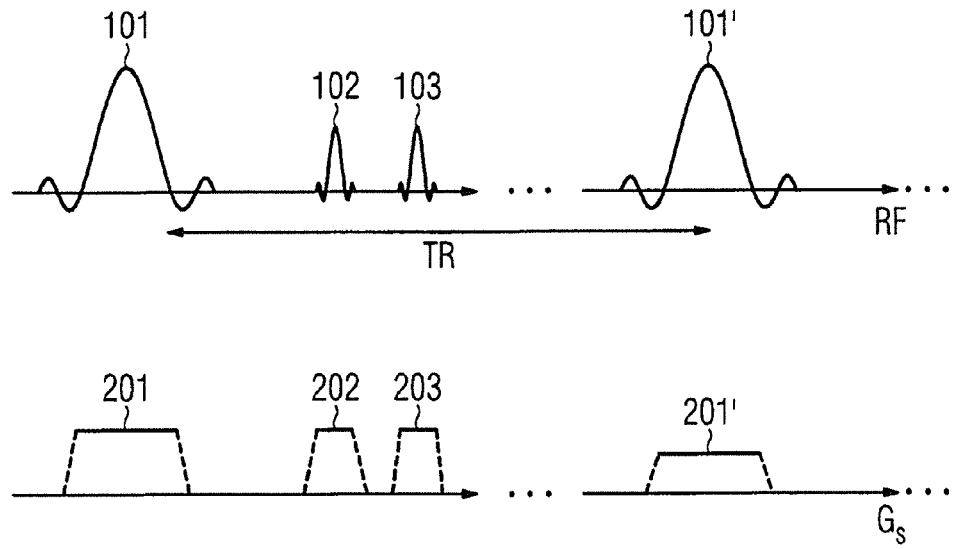
FIG. 2 schematically illustrates a pulse sequence generated according to the invention.

FIG. 2 schematically shows a pulse sequence according to the invention. A pulse sequence according to the invention has at least two RF pulses or more RF pulses. Shown as an example is a pulse sequence that has three RF pulses 101, 102, 103, which should be radiated in chronological succession into the examination subject (top line, labeled with "RF"). However, a pulse sequence according to the invention can also have more than three RF pulses, wherein its design is to proceed analogously.

According to the pulse sequence, a respective slice selection gradient 201, 202, 203 (bottom line, labeled with "$G_S$") is to be applied simultaneously with the respective RF pulses. Here a sequence of RF pulses with associated gradient pulses is designated as a pulse sequence, which pulse sequence is repeated with modified gradient pulses 201' (RF pulse 101', . . . ) in order to acquire the desired measurement data bit by bit.

According to the invention, the bandwidths of at least two of the RF pulses 101, 102, 103 that occur in the pulse sequence are matched such that the matched RF pulses respectively excite a congruent slice if they are radiated into an examination subject under the effect of a slice selection gradient of identical amplitude). The contrast is thus maintained even given distortions due to nonlinearities and inhomogeneities in the applied magnetic field, since these are respectively based on the same nonlinearities and inhomogeneities.

In one exemplary embodiment, the pulse sequence is an inversion recovery sequence (for example a STIR sequence) and thus comprises an inversion pulse 101 which is followed by an excitation pulse 102.

The bandwidth of the inversion pulse 101 is matched with the bandwidth of the excitation pulse 102, for example, such that both the slice inverted by the inversion pulse 102 and the slice subsequently excited by the excitation pulse 102 are congruent given the respectively applied slice selection gradients 201 and 202 of the same amplitude. No artifacts thus occur due to an inversion of the "wrong" slice, and the (STIR) contrast is maintained.

Additionally or alternatively, the bandwidths of additional RF pulses of the pulse sequence 101, 103 (for example also all occurring RF pulses) can also be matched with the bandwidth of the excitation pulse 102 in the same manner. For example, such additional RF pulses can comprise refocusing pulses or DEFT pulses or the like. In this way, given these RF pulses 101, 103 the slice excited by the excitation pulse 101 and the slice refocused by the additional RF pulse 103 are also congruent, whereby signal losses and/or contrast changes in the resulting MR image can be avoided.

Figure 3:
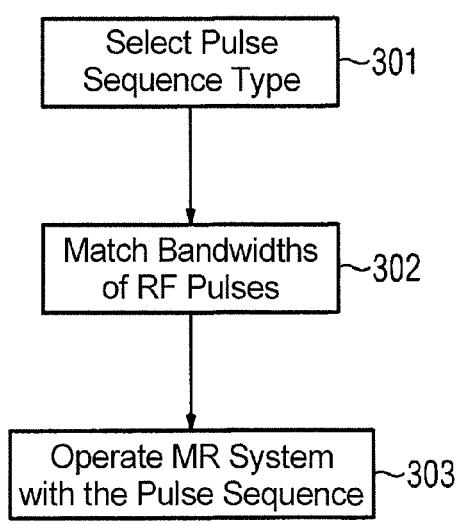
FIG. 3 is a schematic flowchart of an embodiment of the method according to the invention.

FIG. 3 shows a schematic workflow diagram of the method according to the invention. In a first Step 301, a pulse sequence type for a desired MR examination is thereby selected (by a user, for example) and parameters of an RF pulse of the pulse sequence type are thereby established.

For example, a STIR sequence is selected for an MR examination on an examination subject afflicted with an interfering body (an implant, for example) with an established excitation pulse. The excitation pulse is thereby established by a selection of the thickness of a slice to be examined, for example.

In a further Step 302, the bandwidth of at least one additional RF pulse of this pulse sequence type is matched with the bandwidth of the established RF pulse of the pulse sequence type, such that the matched RF pulses respectively excite a congruent slice when they are radiated into an examination subject under the effect of a slice selection gradient of identical amplitude. The advantages already described above are thereby achieved.

The pulse sequence generated in a last step 303 can be transmitted to a control device 6 of a magnetic resonance system 5 in order to implement a corresponding MR examination.

The matching of the RF pulse properties can possibly take place manually, or preferably automatically. It may occur that the selected pulse sequence and the properties of the RF pulse that is established are changed, for instance given a change of the sequence parameters by selection of different RF modes in the user interface at the terminal of the magnetic resonance system, or by a sequence-internal adaptation such as a change of the pulse lengths depending on the selected slice thickness. For this purpose, a special mode for such a matched pulse sequence can be offered to a user that, for example, specifically produces the matching of the remaining RF pulses in the manner described above for implant imaging after selection of the pulse sequence type and establishment of an RF pulse (for example the excitation pulse) by the selection of the desired slice thickness.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of generating a pulse sequence that operates a magnetic resonance system comprising:
   in a processor, generating a pulse sequence, comprised of a plurality of pulses in a chronological succession, configured to operate a magnetic resonance system, in which a basic magnetic field is present, in order to acquire magnetic resonance data from a subject within the magnetic resonance system, said subject comprising a non-tissuous object therein that produces localized inhomogeneity in said basic magnetic field that interferes with the acquisition of said magnetic resonance data, said processor configuring said pulse sequence with at least two radio-frequency (RF) pulses;
   in said processor, also setting respective bandwidths of at least two of said RF pulses to be matched so as to configure said at least two of said RF pulses with matched bandwidths in order to respectively excite congruent slices of said examination subject when radiated into the subject under an effect of a slice selection gradient having an identical amplitude during each of said at least two of said RF pulses in said pulse sequence, with the congruency of said slices produced by said matched bandwidths causing non-linearity and inhomogeneity in said slices, produced by said non-tissuous object, to be the same in each of said slices so that said slices are not inconsistently excited with respect to each other;
   and making said pulse sequence, with said at least two of said RF pulses having said matched bandwidths, available at an output of said processor in an electronic form that is configured to operate said magnetic resonance system.

2. A method as claimed in claim 1 comprising locating one of said at least two RF pulses, at a chronological position in said pulse sequence, in order to cause said one of said at least two RF pulses to function as an inversion pulse.

3. A method as claimed in claim 1 comprising locating one of said at least two RF pulses, at a chronological position in said pulse sequence, in order to cause said one of said at least two RF pulses to function as an excitation pulse.

4. A method as claimed in claim 1 comprising locating one of said at least two RF pulses, at a chronological position in said pulse sequence, in order to cause said one of said at least two RF pulses to function as a refocusing pulse.

5. A method of operating a magnetic resonance system, in which a basic magnetic field is present, in order to acquire magnetic resonance data from a subject within the magnetic resonance system, said subject comprising a non-tissuous object therein that produces localized inhomogeneity in said basic magnetic field that interferes with the acquisition of said magnetic resonance data, said method comprising:
   from a computerized controller, providing a pulse sequence, comprised of a plurality of pulses in a chronological succession including at least two radio-frequency (RF) pulses, to said data acquisition unit
   in said controller, setting respective bandwidths of at least two of said RF pulses to be matched so as to configure said at least two of said RF pulses with matched bandwidths in order to respectively excite congruent slices of said examination subject when radiated into the subject under an effect of a slice selection gradient having an identical amplitude, during each of said at least two of said RF pulses in said pulse sequence, with the congruency of said slices produced by said matched bandwidths causing non-linearity and inhomogeneity in said slices, produced by said non-tissuous object, to be the same in each of said slices so that said slices are not inconsistently excited with respect to each other;
   and from said controller, operating said data acquisition unit according to said pulse sequence with said at least two of said RF pulses having said matched bandwidths.

6. A method as claimed in claim 5 comprising locating one of said at least two RF pulses, at a chronological position in said pulse sequence, in order to cause said one of said at least two RF pulses to function as an inversion pulse.

7. A method as claimed in claim 5 comprising locating one of said at least two RF pulses, at a chronological position in said pulse sequence, in order to cause said one of said at least two RF pulses to function as an excitation pulse.

8. A method as claimed in claim 5 comprising locating one of said at least two RF pulses, at a chronological position in said pulse sequence, in order to cause said one of said at least two RF pulses to function as a refocusing pulse.

9. A magnetic resonance (MR) apparatus comprising:
an MR data acquisition unit, in which a basic magnetic field is present;
a controller provided with a pulse sequence, comprised of a plurality of pulses in a chronological succession, configured to operate the MR data acquisition unit and configured to acquire magnetic resonance data from a subject within the magnetic resonance data acquisition unit, said subject comprising a non-tissuous object therein that produces localized inhomogeneity in said basic magnetic field that interferes with the acquisition of said magnetic resonance data, said processor configuring said pulse sequence with at least two radio-frequency (RF) pulses;
said controller being configured to set respective bandwidths of at least two of said RF pulses so as to be matched in order to configure said at least two of said RF pulses with matched bandwidths in order to respectively excite congruent slices of said examination subject when radiated into the subject under an effect of a slice selection gradient having an identical amplitude, during each of said at least two of said RF pulses in said pulse sequence, with the congruency of said slices produced by said matched bandwidths causing non-linearity and inhomogeneity in said slices, produced by said non-tissuous object, to be the same in each of said slices so that said slices are not inconsistently excited with respect to each other; and
said controller being configured to operate said MR data acquisition unit according to said pulse sequence with said at least two of said RF pulses having said matched bandwidths.

10. A non-transitory computer-readable data storage medium encoded with programming instructions, said programming instructions being loaded into a processor and causing said processor to:
generate a pulse sequence, comprised of a plurality of pulses in a chronological succession, configured to operate a magnetic resonance system, in which a basic magnetic field is present, in order to acquire magnetic resonance data from a subject within the magnetic resonance system, said subject comprising a non-tissuous object therein that produces localized inhomogeneity in said basic magnetic field that interferes with the acquisition of said magnetic resonance data, said processor configuring said pulse sequence with at least two radio-frequency (RF) pulses;
set respective bandwidths of at least two of said RF pulses to be matched in order to configure said at least two of said RF pulses with matched bandwidths in order to respectively excite congruent slices of said examination subject when radiated into the subject under an effect of a slice selection gradient having an identical amplitude, during each of said at least two of said RF pulses in said pulse sequence, with the congruency of said slices produced by said matched bandwidths causing non-linearity and inhomogeneity in said slices, produced by said non-tissuous object, to be the same in each of said slices so that said slices are not inconsistently excited with respect to each other; and
make said pulse sequence, with said at least two of said RF pulses having said matched bandwidths, available at an output of said processor in an electronic form that is configured to operate said magnetic resonance system.

11. A non-transitory computer-readable data storage medium encoded with programming instructions, said data storage medium being loaded into a computerized control system of a magnetic resonance system, comprising a magnetic resonance data acquisition unit, in which a basic magnetic field is present, and said programming instructions causing said computerized control system to:
generate a pulse sequence, comprised of a plurality of pulses in a chronological succession, configured to operate the magnetic resonance data acquisition unit and configured to acquire magnetic resonance data from a subject within the magnetic resonance data acquisition unit, said subject comprising a non-tissuous object therein that produces localized inhomogeneity in said basic magnetic field that interferes with the acquisition of said magnetic resonance data, said processor configuring said pulse sequence with at least two radio-frequency (RF) pulses;
set respective bandwidths of at least two of said RF pulses so as to be matched in order to configure said at least two of said RF pulses with matched bandwidths and in order to respectively excite congruent slices of said examination subject, when radiated into the subject under an effect of a slice selection gradient having an identical amplitude, during each of said at least two of said RF pulses in said pulse sequence, with the congruency of said slices produced by said matched bandwidths causing non-linearity and inhomogeneity in said slices, produced by said non-tissuous object, to be the same in each of said slices so that said slices are not inconsistently excited with respect to each other; and
operate said magnetic resonance data acquisition unit according to said pulse sequence with said at least two of said RF pulses having said matched bandwidths.

* * * * *